(12) United States Patent
Takahashi et al.

(10) Patent No.: US 9,707,759 B2
(45) Date of Patent: Jul. 18, 2017

(54) LIQUID-EJECTING HEAD AND METHOD OF MANUFACTURING THE LIQUID-EJECTING HEAD

(71) Applicant: CANON KABUSHIKI KAISHA, Tokyo (JP)

(72) Inventors: Hyou Takahashi, Kunitachi (JP); Kazunari Ishizuka, Suntou-gun (JP); Yohei Hamade, Tokyo (JP); Ken Ikegame, Ebina (JP); Satoshi Tsutsui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/005,268

(22) Filed: Jan. 25, 2016

(65) Prior Publication Data

US 2016/0236467 A1 Aug. 18, 2016

(30) Foreign Application Priority Data

Feb. 18, 2015 (JP) .................................. 2015-029342

(51) Int. Cl.

| B41J 2/14 | (2006.01) |
| B41J 2/16 | (2006.01) |
| G03F 7/16 | (2006.01) |
| G03F 7/38 | (2006.01) |
| G03F 7/00 | (2006.01) |

(52) U.S. Cl.
CPC ........... *B41J 2/1433* (2013.01); *B41J 2/1603* (2013.01); *B41J 2/1606* (2013.01); *B41J 2/1631* (2013.01); *B41J 2/1637* (2013.01); *G03F 7/0015* (2013.01); *G03F 7/16* (2013.01); *G03F 7/38* (2013.01)

(58) Field of Classification Search
CPC ....................................................... B41J 2/1606
See application file for complete search history.

(56) References Cited

U.S. PATENT DOCUMENTS

| 8,741,549 B2 | 6/2014 | Ishizuka |
| 8,957,151 B2 | 2/2015 | Tsutsui et al. |
| 9,029,074 B2 | 5/2015 | Hamade et al. |
| 9,150,697 B2 | 10/2015 | Sawada et al. |
| 2011/0081493 A1* | 4/2011 | Matsushita ............ B41J 2/1606 427/384 |

(Continued)

FOREIGN PATENT DOCUMENTS

| JP | 2009-214338 A | 9/2009 | |
| JP | WO 2013157659 A1 * | 10/2013 | ............ B41J 2/1603 |

OTHER PUBLICATIONS

Sawada et al., U.S. Appl. No. 15/002,798, filed Jan. 21, 2016.

*Primary Examiner* — Shelby Fidler
(74) *Attorney, Agent, or Firm* — Fitzpatrick, Cella, Harper & Scinto

(57) ABSTRACT

Provided is a liquid-ejecting head, including a member having opened therein an ejection orifice configured to eject a liquid, in which the liquid-ejecting head has, on a side being positioned on the member and having opened therein the ejection orifice, a cured layer of a mixture containing: (a) a condensate of hydrolyzable silane compounds containing a hydrolyzable silane compound having 20 or more fluorine atoms and a hydrolyzable silane compound having a cationically polymerizable group; (b) a fluorine atom-containing nonionic surfactant; and (c) an epoxy resin.

15 Claims, 2 Drawing Sheets

(56) References Cited

U.S. PATENT DOCUMENTS

| | | | |
|---|---|---|---|
| 2013/0108963 A1* | 5/2013 | Tanaka | G03F 7/004 430/283.1 |
| 2014/0309329 A1 | 10/2014 | Sawada et al. | |
| 2014/0311661 A1 | 10/2014 | Tsutsui et al. | |
| 2015/0116427 A1 | 4/2015 | Tsutsui et al. | |
| 2015/0251419 A1 | 9/2015 | Sawada et al. | |
| 2015/0275043 A1* | 10/2015 | Kikuchi | C09D 183/04 428/220 |

* cited by examiner

LIQUID-EJECTING HEAD AND METHOD OF MANUFACTURING THE LIQUID-EJECTING HEAD

BACKGROUND OF THE INVENTION

Field of the Invention

The present invention relates to a liquid-ejecting head and a method of manufacturing the liquid-ejecting head.

Description of the Related Art

In an inkjet recording head, satisfactory ink ejection performance is required. When an ink remains in the vicinity of an ejection orifice, a flying direction of an ink droplet is deflected and an ejection rate of the ink droplet lowers in some cases. In view of the foregoing, a method involving subjecting the periphery of the ejection orifice portion to a liquid-repellent treatment as described in Japanese Patent Application Laid-Open No. 2009-214338 is given as an example of a method of accurately ejecting an ink through the alleviation of those problems. In addition, in this case, the liquid-repellent treatment to which the periphery has been subjected is required to have durability against the ink.

Further, in the inkjet recording head, an ejection orifice having a structure that is additionally complicated and has additionally high definition has been desired in recent years. A method involving using a photolithography technology has been known as one method of obtaining a high-definition ejection orifice. In this case, in order to obtain the high-definition ejection orifice, the pattern of a photomask is required to be formed with high mask reproducibility.

SUMMARY OF THE INVENTION

It is difficult to subject a water-repellent compound to be used in the method described in Japanese Patent Application Laid-Open No. 2009-214338 to pattern formation by photolithography, and hence a high-definition ejection orifice cannot be obtained. The present invention is directed to provide a liquid-ejecting head having a high-definition ejection orifice having high liquid repellency and high durability against a liquid.

According to one aspect of the present invention, there is provided a liquid-ejecting head, including a member having opened therein an ejection orifice configured to eject a liquid, in which the liquid-ejecting head has, on a side being positioned on the member and having opened therein the ejection orifice, a cured layer of a mixture containing: (a) a condensate of hydrolyzable silane compounds containing a hydrolyzable silane compound having 20 or more fluorine atoms and a hydrolyzable silane compound having a cationically polymerizable group; (b) a fluorine atom-containing nonionic surfactant; and (c) an epoxy resin.

According to another aspect of the present invention, there is provided a method of manufacturing a liquid-ejecting head including a substrate and a member arranged on or above the substrate, the member having opened therein an ejection orifice configured to eject a liquid, the method including: forming, on or above the substrate, a coating layer containing a photocationically polymerizable resin; applying, onto the coating layer, a mixed liquid containing (a) a condensate of hydrolyzable silane compounds containing a hydrolyzable silane compound having 20 or more fluorine atoms and a hydrolyzable silane compound having a cationically polymerizable group, (b) a fluorine atom-containing nonionic surfactant, (c) an epoxy resin, and an organic solvent to form an applied film; subjecting the coating layer and the applied film to pattern exposure; heating the coating layer and the applied film to cure exposed portions thereof; and removing unexposed portions of the coating layer and the applied film to form the ejection orifice.

According to still another aspect of the present invention, there is provided a method of manufacturing a liquid-ejecting head including a substrate and a member arranged on or above the substrate, the member having opened therein an ejection orifice configured to eject a liquid, the method including: forming, on or above the substrate, a coating layer containing a photocationically polymerizable resin; applying, onto the coating layer, a mixed liquid containing (a) a condensate of hydrolyzable silane compounds containing a hydrolyzable silane compound having 20 or more fluorine atoms and a hydrolyzable silane compound having a cationically polymerizable group, (b) a fluorine atom-containing nonionic surfactant, and an organic solvent that dissolves the photocationically polymerizable resin to form an applied film; subjecting the coating layer and the applied film to pattern exposure; heating the coating layer and the applied film to cure exposed portions thereof; and removing unexposed portions of the coating layer and the applied film to form the ejection orifice.

Further features of the present invention will become apparent from the following description of exemplary embodiments with reference to the attached drawings.

DESCRIPTION OF THE EMBODIMENTS

Figure 1:
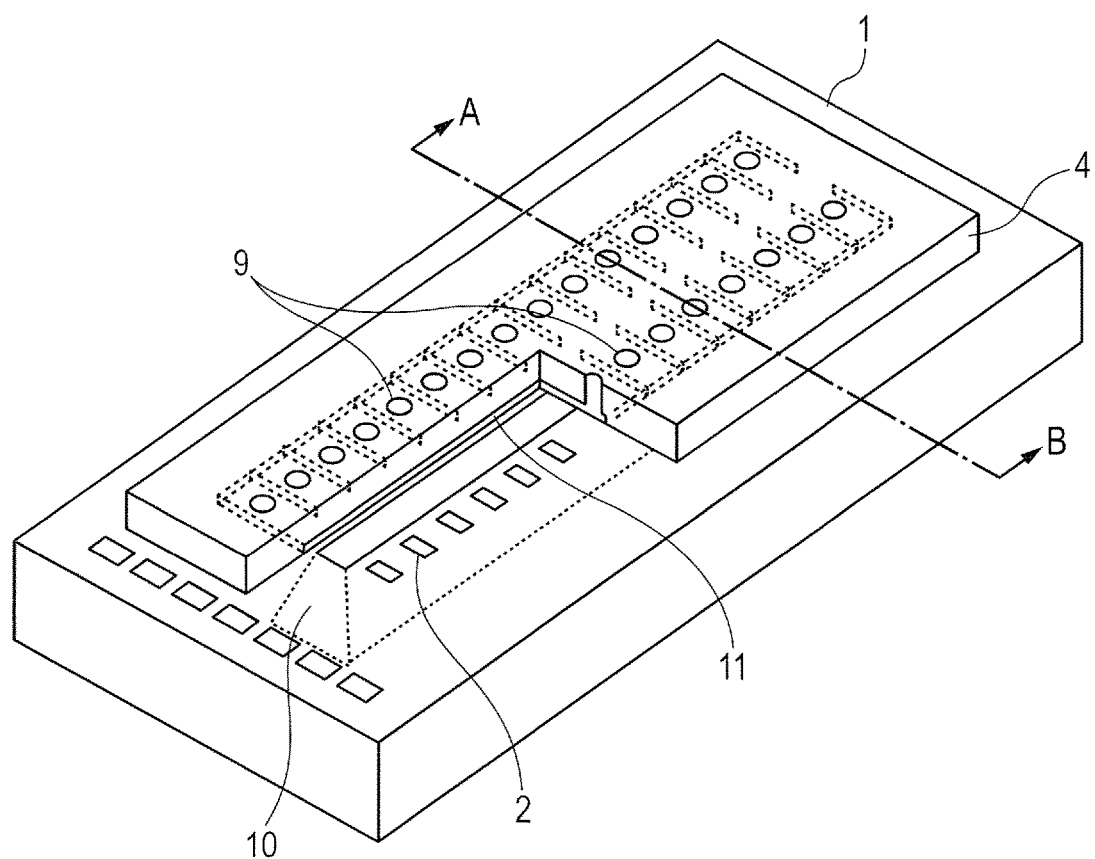
FIG. 1 is a perspective view for illustrating an example of a liquid-ejecting head according to the present invention.

Embodiments of the present invention are described in detail below with reference to the attached drawings. It should be noted that in the following descriptions, configurations having the same function are denoted by the same number in the drawings, and descriptions thereof are omitted in some cases.

[Liquid-Ejecting Head]

A liquid-ejecting head according to the present invention includes a member having opened therein an ejection orifice configured to eject a liquid. In addition, the liquid-ejecting head has, on a side being positioned on the member and having opened therein the ejection orifice, a layer showing liquid repellency that is a cured layer of a mixture containing the following components (a) to (c): (a) a condensate of hydrolyzable silane compounds containing a hydrolyzable silane compound having 20 or more fluorine atoms and a hydrolyzable silane compound having a cationically polymerizable group (hereinafter sometimes referred to as "(a) the condensate"), (b) a fluorine atom-containing nonionic surfactant, and (c) an epoxy resin. That is, the liquid-ejecting head has, on a surface on a side which is positioned on the member and on which the liquid is ejected from the ejection orifice (hereinafter sometimes referred to as "first surface"), a layer obtained by curing the mixture containing the components (a) to (c). It should be noted that a boundary between the member and the layer is not required to be clear, and the layer needs only to be formed on the member.

In the present invention, the cured layer showing high liquid repellency in which the hydrolyzable silane compound having 20 or more fluorine atoms and the hydrolyzable silane compound having a cationically polymerizable group are chemically bonded to each other is present on the surface having opened therein the ejection orifice configured to eject the liquid. Accordingly, a liquid-ejecting head having high liquid repellency and having a high adhesion property with a base, i.e., having high durability against the liquid, such as an ink, is obtained. The cured layer contains the fluorine atom-containing nonionic surfactant and the epoxy resin in addition to the condensate of the hydrolyzable silane compounds, and hence a liquid-ejecting head having a high-definition ejection orifice having high mask reproducibility is obtained. The liquid-ejecting head according to the present invention can be preferably used as an inkjet recording head configured to eject the ink onto a recording medium to perform recording.

In FIG. 1, an example of the liquid-ejecting head according to the present invention is illustrated. The liquid-ejecting head illustrated in FIG. 1 includes: a substrate 1 including an energy-generating element 2 configured to provide a liquid with ejection energy; and a member 4 on the substrate 1, the member having opened therein an ejection orifice 9 configured to eject the liquid. A liquid-repellent cured layer (not shown) is formed on a side being positioned on the member 4 and having opened therein the ejection orifice 9. The cured layer is a layer obtained by curing the mixture containing the components (a) to (c). A liquid channel 11 is formed between the substrate 1 and the member 4. In addition, a supplying portion 10 for supplying the liquid is formed in the substrate 1. The liquid is supplied from the supplying portion 10 to the channel 11, and the liquid in the channel 11 is provided with the energy by the energy-generating element 2 and ejected from the ejection orifice 9.

<(a) Condensate>

The structure of the hydrolyzable silane compound having 20 or more fluorine atoms in the hydrolyzable silane compounds constituting (a) the condensate is not particularly limited as long as the compound has 20 or more fluorine atoms. The number of the fluorine atoms is preferably 22 or more. An upper limit for the number of the fluorine atoms is not particularly limited, but can be set to, for example, 36 or less. The hydrolyzable silane compound preferably has a group containing a fluorine atom. The group containing a fluorine atom is preferably a perfluoroalkyl group or a perfluoropolyether group, more preferably a perfluoropolyether group.

The perfluoropolyether group is preferably a group represented by the following formula (5) from the viewpoints of the liquid repellency and liquid resistance (ink resistance) of the liquid-ejecting head.

Formula (5)

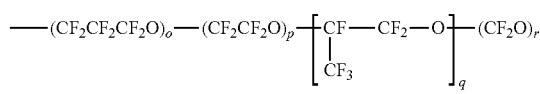

In the formula (5), o, p, q, and r each represent an integer of 0 or 1 or more, and at least one of o, p, q, or r represents an integer of 1 or more.

At least one of o, p, q, or r in the formula (5) represents preferably an integer of from 1 to 10, more preferably an integer of from 3 to 8 from the viewpoints of the liquid repellency and the liquid resistance. It should be noted that in the formula (5), the order of respective repeating units each having a number of repeating units o, p, q, or r is not particularly limited, and the repeating units may be randomly incorporated or may be incorporated as a block. In addition, the number of the fluorine atoms of the perfluoropolyether group is preferably 20 or more.

The weight-average molecular weight of the perfluoropolyether group is preferably from 600 to 5,000, more preferably from 700 to 2,000. When the weight-average molecular weight of the perfluoropolyether group is 600 or more, sufficient liquid repellency is expressed. In addition, when the weight-average molecular weight of the perfluoropolyether group is 5,000 or less, the solubility of the compound in a solvent improves. It should be noted that the perfluoropolyether group is a mixture of groups having different numbers of repeating units because of its characteristics, and hence its weight-average molecular weight is discussed. In addition, in the case of the formula (5), the weight-average molecular weight of the perfluoropolyether group represents the total sum of the molecular weights of repeating unit portions having the numbers of repeating units o, p, q, and r. The weight-average molecular weight is a value measured by gel permeation chromatography (GPC).

The hydrolyzable silane compound having 20 or more fluorine atoms, the compound having a perfluoropolyether group, is preferably at least one kind of compounds represented by the following formulae (1), (2), (3), and (4) from the viewpoints of the liquid repellency and the liquid resistance.

$$F\text{-}Rp\text{-}A\text{-}SiX_aY_{3-a} \qquad \text{Formula (1)}$$

In the formula (1), Rp represents a perfluoropolyether group, A represents an organic group having 1 to 12 carbon atoms, X represents a hydrolyzable substituent, Y represents a non-hydrolyzable substituent, and a represents an integer of from 1 to 3.

$$R_{3-a}X_a\text{-}Si\text{-}A\text{-}Rp\text{-}A\text{-}SiX_aY_{3-a} \qquad \text{Formula (2)}$$

In the formula (2), R represents a non-hydrolyzable substituent, and Rp, A, X, Y, and a are identical in meaning to those in the formula (1).

Formula (3)

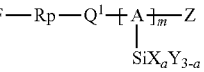

In the formula (3), A represents an organic group having 1 to 12 carbon atoms, Z represents a hydrogen atom or an alkyl group, $Q^1$ represents a divalent bonding group, m represents an integer of from 1 to 4, and Rp, X, Y, and a are identical in meaning to those in the formula (1).

$$F\text{-}Rp\text{-}Q^2\text{-}(\text{-}A\text{-}SiX_aY_{3-a})_n \qquad \text{Formula (4)}$$

In the formula (4), n represents 1 or 2, when n=1, $Q^2$ represents a divalent bonding group, and when n=2, $Q^2$ represents a trivalent bonding group, and Rp, A, X, Y, and a are identical in meaning to those in the formula (1).

In the formulae (1) to (4), Rp may represent a perfluoropolyether group represented by the formula (5). X represents, for example, a halogen atom, an alkoxy group, such as a methoxy group or an ethoxy group, an amino group, or a hydrogen atom. Of those, an alkoxy group, such as a methoxy group or an ethoxy group, is preferred from the viewpoint that a group desorbed by a hydrolysis reaction does not inhibit a cationic polymerization reaction and hence the reaction can be easily controlled. Y represents, for example, an alkyl group having 1 to 20 carbon atoms or a phenyl group. A represents, for example, a methylene group, an ethylene group, a propylene group, or a methyleneoxypropylene group. Examples of the alkyl group represented by Z include a methyl group, an ethyl group, and a propyl group. R represents, for example, an alkyl group having 1 to 20 carbon atoms or a phenyl group. When $Q^2$ represents a divalent bonding group, $Q^2$ represents, for example, an oxygen atom, $-CF_2CF_2-$, $-C(=O)-CH_2-$, or $-CF(CF_3)-C(=O)-CH_2-$. When $Q^2$ represents a trivalent bonding group, $Q^2$ represents, for example, a nitrogen atom, a 1,1-perfluoroethylenecarbonylamine group, or $-CH_2-CH_2-N$. Examples of the group represented by $Q^1$ can be the same as those when $Q^2$ represents a divalent bonding group. a preferably represents 2 or 3. m preferably represents an integer of from 1 to 3.

The hydrolyzable silane compound having 20 or more fluorine atoms, the compound having a perfluoropolyether group, is more preferably a compound represented by any one of the following formulae (8) to (12). One kind of those compounds may be used, or two or more kinds thereof may be used in combination.

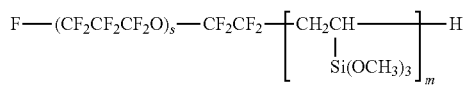

Formula (8)

In the formula (8), s represents an integer of from 3 to 20, and m represents an integer of from 1 to 4.

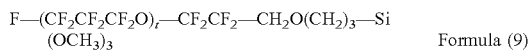

Formula (9)

In the formula (9), t represents an integer of from 3 to 20.

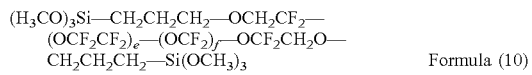

Formula (10)

In the formula (10), e represents an integer of from 0 to 20 and f represents an integer of from 0 to 30, provided that e and f represent integers satisfying e×4+f×2>15.

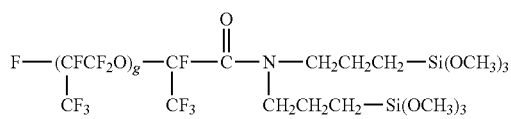

Formula (11)

In the formula (11), g represents an integer of from 3 to 20.

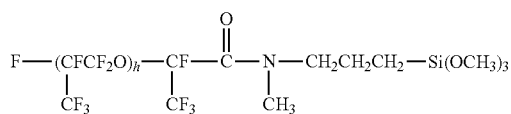

Formula (12)

In the formula (12), h represents an integer of from 3 to 20.

The structure of the hydrolyzable silane compound having a cationically polymerizable group in the hydrolyzable silane compounds constituting (a) the condensate is not particularly limited as long as the compound has a cationically polymerizable group. However, the compound is preferably a compound represented by the following formula (6) from the viewpoint of the adhesiveness of the cured layer with a lower layer.

Formula (6)

In the formula (6), Rc represents a nonhydrolyzable substituent having an epoxy group, an oxetane group, or a cationically polymerizable vinyl group, R represents a nonhydrolyzable substituent, X represents a hydrolyzable substituent, and b represents an integer of from 0 to 2.

The cationically polymerizable vinyl group in Rc is, for example, $CH_2=CH-CH_2-CH_2-$. Rc preferably represents a nonhydrolyzable substituent having an epoxy group. Specific examples thereof include a glycidoxypropyl group and an epoxycyclohexylethyl group. R represents, for example, an alkyl group, such as a methyl group or an ethyl group, or a phenyl group. X represents, for example, an alkoxy group, such as a methoxy group or an ethoxy group, a halogen atom, or a hydrogen atom. b represents preferably 0 or 1, more preferably 0.

Specific examples of the compound represented by the formula (6) include glycidoxypropyltrimethoxysilane, glycidoxypropyltriethoxysilane, epoxycyclohexylethyltrimethoxysilane, epoxycyclohexylethyltriethoxysilane, glycidoxypropylmethyldimethoxysilane, glycidoxypropylmethyldiethoxysilane, glycidoxypropyldimethylmethoxysilane, and glycidoxypropyldimethylethoxysilane. One kind of those compounds may be used, or two or more kinds thereof may be used in combination.

The hydrolyzable silane compounds constituting (a) the condensate preferably further contain a hydrolyzable silane compound represented by the following formula (7). It should be noted that the hydrolyzable silane compound represented by the following formula (7) is a compound except the hydrolyzable silane compound having 20 or more fluorine atoms and the hydrolyzable silane compound having a cationically polymerizable group.

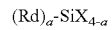

Formula (7)

In the formula (7), Rd represents a substituted or unsubstituted alkyl group having 1 to 13 carbon atoms, or a substituted or unsubstituted aryl group having 6 to 13 carbon atoms, X represents a hydrolyzable substituent, and a represents an integer of from 1 to 3.

In the formula (7), examples of the alkyl group represented by Rd include a methyl group, an ethyl group, a propyl group, a butyl group, and a hexyl group. Examples of the aryl group represented by Rd include a phenyl group and a naphthyl group. A substituent of each of the alkyl group and the aryl group each represented by Rd is, for example, a fluorine atom. X represents, for example, an alkoxy group, such as a methoxy group, an ethoxy group, or a propoxy group, a halogen atom, or a hydrogen atom. a preferably represents 1 or 2.

Specific examples of the hydrolyzable silane compound represented by the formula (7) include methyltrimethoxysilane, methyltriethoxysilane, methyltripropoxysilane, ethyltrimethoxysilane, ethyltriethoxysilane, ethyltripropoxysilane, propyltrimethoxysilane, propyltriethoxysilane, propyltripropoxysilane, dimethyldimethoxysilane, dimethyldiethoxysilane, trimethylmethoxysilane, trimethylethoxysilane, phenyltrimethoxysilane, phenyltriethoxysilane, phenyltripropoxysilane, trifluoropropyltrimethoxysilane, trifluoropropyltriethoxysilane, trifluoropropyltripropoxysilane, perfluorophenyltrimethoxysilane, perfluorophenyltriethoxysilane, and perfluorophenyltripropoxysilane. One kind of those compounds may be used, or two or more kinds thereof may be used in combination.

When (a) the condensate is a condensate of the hydrolyzable silane compounds containing the hydrolyzable silane compound having 20 or more fluorine atoms, the hydrolyzable silane compound having a cationically polymerizable group, and the hydrolyzable silane compound represented by the formula (7), the mobility of the condensate is improved and hence the orientation of a fluorine atom-containing group toward an air interface is accelerated. In addition, the presence of an alkyl group or an aryl group suppresses the cleavage of a siloxane bond due to the nucleophilic attack of an ink component or the like, and hence improves the liquid repellency of the liquid-ejecting head and its durability against a liquid.

The blending ratio of each hydrolyzable silane compound constituting (a) the condensate is appropriately determined in accordance with its form of use. However, when the number of moles of the entire hydrolyzable silane compounds is defined as 100 mol %, the blending ratio of the hydrolyzable silane compound having 20 or more fluorine atoms is preferably from 0.01 mol % to 10 mol %, more preferably from 0.05 mol % to 8 mol %. When the blending ratio is 0.01 mol % or more, sufficient liquid repellency and sufficient durability against a liquid are obtained. In addition, when the blending ratio is 10 mol % or less, the agglomeration and precipitation of a component containing a fluorine atom can be suppressed, and hence the edge roughness of the ejection orifice can be suppressed and its mask reproducibility improves.

When the number of moles of the entire hydrolyzable silane compounds is defined as 100 mol %, the blending ratio of the hydrolyzable silane compound having a cationically polymerizable group is preferably from 10 mol % to 90 mol %, more preferably from 30 mol % to 70 mol %. When the blending ratio is 10 mol % or more, the durability of the layer against a liquid is improved. In addition, when the blending ratio is 90 mol % or less, a reduction in liquid repellency due to the hydrophilicity of the cationically polymerizable group can be suppressed.

When the number of moles of the entire hydrolyzable silane compounds is defined as 100 mol %, the blending ratio of the hydrolyzable silane compound represented by the formula (7) is preferably from 0 mol % to 80 mol %, more preferably from 10 mol % to 60 mol %. When the blending ratio is 10 mol % or more, the agglomeration and precipitation of the component containing a fluorine atom can be suppressed. In addition, when the blending ratio is 60 mol % or less, liquid repellency and durability against a liquid are obtained.

In the present invention, each of the hydrolyzable silane compounds is not used as it is, but the hydrolyzable silane compounds are condensed to be used. With this, the compatibility of a mixed liquid containing the hydrolyzable silane compounds with the coating layer serving as the base, and its film formation property at the time of application, become satisfactory, and satisfactory characteristics can be obtained also when patterning is performed by cationic photopolymerization. This condensation reaction is performed by allowing a hydrolysis/condensation reaction to proceed under heating in the presence of water. A desired condensation degree can be obtained by appropriately controlling the hydrolysis/condensation reaction by a temperature, a time, a pH, and the like.

In this case, the degree to which the condensation reaction proceeds (condensation degree) can be defined by a ratio of the number of condensed functional groups with respect to the number of condensable functional groups. In this case, the condensable functional groups correspond to the above-mentioned hydrolyzable substituents. The condensation degree can be estimated by $^{29}$Si-NMR measurement. For example, in the case of a hydrolyzable silane compound having three hydrolyzable substituents in one molecule, the condensation degree is calculated according to the following equation. It should be noted that T0, T1, T2, and T3 in the equation of the condensation degree represent ratios of T0 form, T1 form, T2 form, and T3 form, respectively.

T0 form: Si atom not bonded to any other hydrolyzable silane compound
T1 form: Si atom bonded to one hydrolyzable silane compound via oxygen
T2 form: Si atom bonded to two hydrolyzable silane compounds via oxygen
T3 form: Si atom bonded to three hydrolyzable silane compounds via oxygen $$\text{Condensation degree }(\%) = \{(T1+2*T2+3*T3)*100\}/\{3*(T0+T1+T2+T3)\}$$

The condensation degree is preferably from 20% to 80%, more preferably from 30% to 70%, still more preferably from 40% to 65%, though a preferred value therefor varies depending on the kinds of the hydrolyzable silane compounds and synthesis conditions therefor. When the condensation degree is 20% or more, the compatibility of a mixed liquid containing the hydrolyzable silane compounds with the coating layer serving as the base and its applicability improve. In addition, the ratio of the T0 form serving as an unreacted silane is preferably 10% or less from the viewpoint that the uniformity of an applied film formed of the mixed liquid improves.

In addition, in the hydrolysis reaction, a metal alkoxide may be utilized as a catalyst for hydrolysis to control the condensation degree. Examples of the metal alkoxide include an aluminum alkoxide, a titanium alkoxide, a zirconium alkoxide, and complexes (e.g., an acetylacetone complex) thereof. One kind of those metal alkoxides may be used, or two or more kinds thereof may be used in combination.

A non-fluorine-based organic solvent, such as an alcohol, is used in the hydrolysis/condensation reaction of the hydrolyzable silane compounds. However, the hydrolyzable silane compound having 20 or more fluorine atoms has low solubility in the non-fluorine-based organic solvent because the compound contains many fluorine atoms. Accordingly, the use of a fluorine-based solvent as a reaction solvent when the hydrolysis/condensation reaction of the hydrolyzable silane compounds is allowed to proceed is conceivable. However, the water content of the fluorine-based solvent is low, which makes it difficult for the reaction to proceed. In view of the foregoing, a uniform condensate can be synthesized by using a mixed liquid of the non-fluorine-based organic solvent and the fluorine-based solvent as a solvent. Therefore, (a) the condensate is preferably a condensate obtained by heating the hydrolyzable silane compounds in the mixed liquid of the non-fluorine-based organic solvent and the fluorine-based solvent.

A non-fluorine-based polar solvent can be used as the non-fluorine-based organic solvent, and an alcohol free of a fluorine atom is preferred. Examples of the alcohol include ethanol, methanol, isopropanol, and 2-butanol. One kind of those alcohols may be used, or two or more kinds thereof may be used in combination. In addition, examples of the fluorine-based solvent include a hydrofluorocarbon, a perfluorocarbon, a hydrofluoroether, a hydrofluoropolyether, and a perfluoropolyether. Of those, a hydrofluoroether, a hydrofluoropolyether, or a perfluoropolyether, which has an oxygen atom and is compatible with water, is preferred because the addition of water is required for hydrolysis, and a hydrofluoroether is more preferred. One kind of those fluorine-based solvents may be used, or two or more kinds thereof may be used in combination.

A blending ratio between the non-fluorine-based organic solvent and the fluorine-based solvent is as follows: the ratio of the fluorine-based solvent is preferably from 0 mass % to 50 mass %, more preferably from 0.01 mass % to 30 mass % with respect to 100 mass % of the total of the non-fluorine-based organic solvent and the fluorine-based solvent.

<(b) Fluorine Atom-Containing Nonionic Surfactant>

A composition containing (a) the condensate is liable to cause the agglomeration and precipitation of a component containing a fluorine atom in, for example, the applying step or developing step of a photolithography process. The inventors of the present invention have found that the agglomeration and precipitation of the component containing a fluorine atom can be significantly suppressed by adding (b) the fluorine atom-containing nonionic surfactant. As a result, the edge roughness of the ejection orifice is alleviated and hence high mask reproducibility is obtained. It is assumed that (b) the fluorine atom-containing nonionic surfactant can suppress the agglomeration and precipitation of the component containing a fluorine atom because the surfactant can achieve surface tension lower than that of a silicone-based surfactant or hydrocarbon-based surfactant to be generally used.

It is preferred that (b) the fluorine atom-containing nonionic surfactant have a fluorine atom-containing group, and the fluorine atom-containing group have 9 or more fluorine atoms. When the fluorine atom-containing group has 9 or more fluorine atoms, additionally low surface tension can be realized, and hence the agglomeration and precipitation of the component containing a fluorine atom can be suppressed. The number of the fluorine atoms of the fluorine atom-containing group is more preferably 13 or more. An upper limit for the number of the fluorine atoms of the fluorine atom-containing group is not particularly limited, but can be set to, for example, 40 or less. It should be noted that when (b) the fluorine atom-containing nonionic surfactant is of an oligomer type or of a polymer type having a main chain, a side chain group thereof preferably has 9 or more fluorine atoms.

Preferred examples of (b) the fluorine atom-containing nonionic surfactant include compounds obtained by substituting the following nonionic surfactants by 9 or more fluorine atoms: polyoxyethylene alkyl ethers, such as polyoxyethylene lauryl ether, polyoxyethylene stearyl ether, and polyoxyethylene oleyl ether; polyoxyethylene aryl ethers, such as polyoxyethylene octylphenyl ether and polyoxyethylene nonylphenyl ether; and polyoxyethylene dialkyl esters, such as polyoxyethylene dilaurate and polyoxyethylene distearate.

As a commercial product thereof, there are given, for example, MEGAFACE F-171, MEGAFACE F-173, MEGAFACE F-444, MEGAFACE F-470, MEGAFACE F-471, MEGAFACE F-475, MEGAFACE F-477, MEGAFACE F-482, MEGAFACE F-555, MEGAFACE F-557, and MEGAFACE F-558 (trade names, manufactured by DIC Corporation), SURFLON S-381, SURFLON S-383, and SURFLON S-393 (trade names, manufactured by AGC Seimi Chemical Co., Ltd.), and Novec FC4430 and Novec FC4432 (trade names, manufactured by 3M Japan Limited). One kind of those commercial products may be used, or two or more kinds thereof may be used in combination.

The content of (b) the fluorine atom-containing nonionic surfactant in the mixture containing the components (a) to (c) is preferably from 0.01 mass % to 20 mass %, more preferably from 0.05 mass % to 18 mass %, still more preferably from 0.1 mass % to 15 mass %.

<(c) Epoxy Resin>

(c) The epoxy resin is not particularly limited, but a preferred example thereof is a polyfunctional epoxy resin having in one molecule a plurality of epoxy groups. Examples of the polyfunctional epoxy resin include a polyfunctional alicyclic epoxy resin, a polyfunctional phenol/novolac-type epoxy resin, a polyfunctional o-cresol novolac-type epoxy resin, a polyfunctional triphenyl novolac-type epoxy resin, and a polyfunctional bisphenol A novolac-type epoxy resin. Of those, a polyfunctional bisphenol A novolac-type epoxy resin, a polyfunctional alicyclic epoxy resin, or a polyfunctional phenol/novolac-type epoxy resin is preferred. For example, JER157S70 (trade name, manufactured by Mitsubishi Chemical Corporation.), EPICLON N-865 (trade name, manufactured by DIC Corporation), or EHPE 3150 or EP-4000S (trade names, manufactured by Daicel Corporation) is preferred as a commercial product thereof.

It is preferred that (c) the epoxy resin have a hydroxyl group. When the cured layer is formed by applying a mixed liquid of the components (a) to (c) and an organic solvent having a hydroxyl group, by virtue of the presence of a hydroxyl group in (c) the epoxy resin, the solubility of (c) the epoxy resin in the organic solvent improves, and hence an applied film excellent in in-plane thickness distribution is obtained. EHPE 3150 or EP-4000S (trade names, manufactured by Daicel Corporation) is a preferred commercial product to be used as the epoxy resin having a hydroxyl group.

It should be noted that (c) the epoxy resin may be incorporated into the layer by applying the mixed liquid of the components (a) to (c) and the organic solvent, or may be incorporated into the layer by the supply of (c) the epoxy resin from the base upon application of a mixed liquid of the component (a), the component (b), and the organic solvent. That is, in this case, the epoxy resin is preferably incorporated into the coating layer, and a cured product of the epoxy resin is preferably incorporated into the member.

The weight-average molecular weight of (c) the epoxy resin is preferably from 500 to 50,000.

The content of (c) the epoxy resin in the mixture containing the components (a) to (c) is preferably from 5 mass % to 90 mass %, more preferably from 15 mass % to 85 mass %, still more preferably from 20 mass % to 80 mass %.

<Organic Solvent>

As described later, the cured layer can be formed by, for example, curing an applied film obtained by applying the mixed liquid of the components (a) to (c) and the organic solvent, or the mixed liquid of the component (a), the component (b), and the organic solvent.

The organic solvent is not particularly limited, but is preferably an organic solvent capable of dissolving the components (a) to (c). Examples of the organic solvent can include organic solvents such as an alkylene glycol monoalkyl ether carboxylate, an alkylene glycol monoalkyl ether, a lactic acid alkyl ester, an alkyl alkoxypropionate, a cyclic lactone (preferably having 4 or more and 10 or less carbon atoms), a monoketone compound that may contain a ring (preferably having 4 or more and 10 or less carbon atoms), an alkylene carbonate, an alkyl alkoxyacetate, an alkyl pyruvate, a compound containing a benzene ring, and an alkyl alcohol (preferably having 1 or more and 7 or less carbon atoms).

Examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Examples of the lactic acid alkyl ester include methyl lactate, ethyl lactate, propyl lactate, and butyl lactate.

Examples of the alkyl alkoxypropionate include ethyl 3-ethoxypropionate, methyl 3-methoxypropionate, methyl 3-ethoxypropionate, and ethyl 3-methoxypropionate.

Examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Examples of the monoketone compound that may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Examples of the alkylene carbonate include propylene carbonate, vinylene carbonate, ethylene carbonate, and butylene carbonate.

Examples of the alkyl alkoxyacetate include 2-methoxyethyl acetate, 2-ethoxyethyl acetate, 2-(2-ethoxyethoxy) ethyl acetate, 3-methoxy-3-methylbutyl acetate, and 1-methoxy-2-propyl acetate.

Examples of the alkyl pyruvate include methyl pyruvate, ethyl pyruvate, and propyl pyruvate.

Examples of the compound containing a benzene ring include benzene, toluene, ethylbenzene, o-xylene, m-xylene, and p-xylene. It should be noted that the expression xylene may refer to a mixture of o-xylene, m-xylene, p-xylene, ethylbenzene, and the like.

Examples of the alkyl alcohol include methanol, ethanol, isopropanol, 1-propanol, 2-propanol, tert-butanol, 1-butanol, 2-butanol, 1-pentanol, 2-pentanol, 3-pentanol, 1-hexanol, 2-hexanol, 3-hexanol, 1-heptanol, 2-heptanol, 3-heptanol, and 4-heptanol.

In addition, the organic solvent is preferably an organic solvent having in its chemical structure at least one hydroxyl group. Examples of the organic solvent include propylene glycol monomethyl ether, propylene glycol monoethyl ether, ethyl lactate, methanol, ethanol, isopropanol, 1-butanol, and 2-butanol. In the present invention, one kind of those organic solvents may be used, or two or more kinds thereof may be used in combination.

The content of the organic solvent in the mixed liquid is preferably adjusted to achieve such a solid content concentration that the mixed liquid can be applied so that the thickness of the cured layer may fall within the range of from 50 nm to 20,000 nm. For example, when the mixed liquid containing the components (a) to (c) and the organic solvent is used, the solid content concentration of the mixed liquid is preferably from 0.01 mass % to 70 mass %, more preferably from 0.05 mass % to 60 mass %, still more preferably from 0.1 mass % to 50 mass %. When the solid content concentration falls within the range, application unevenness upon application of the mixed liquid can be suppressed, and an applied film having a desired thickness can be obtained.

The content of (a) the condensate in the mixed liquid is preferably from 0.1 mass % to 20 mass %, more preferably from 1 mass % to 10 mass % in terms of a solid content concentration. When the content falls within the range, sufficient liquid repellency and sufficient durability against a liquid are obtained, and uniform liquid repellency is obtained in the entire surface of the applied film.

The content of (b) the fluorine atom-containing nonionic surfactant in the mixed liquid is preferably from 0.01 mass % to 20 mass %, more preferably from 0.05 mass % to 18 mass %, still more preferably from 0.1 mass % to 15 mass % in the total solid content of the mixed liquid. When the content falls within the range, the agglomeration and precipitation of a component containing a fluorine atom upon application of the mixed liquid are suppressed, and hence a cured layer having a satisfactory surface state is obtained.

When the mixed liquid contains (c) the epoxy resin, the content of (c) the epoxy resin in the mixed liquid is preferably from 5 mass % to 90 mass %, more preferably from 15 mass % to 85 mass %, still more preferably from 20 mass % to 80 mass % in the total solid content of the mixed liquid. When the content falls within the range, the agglomeration and the precipitation upon application of the mixed liquid are suppressed, and hence a cured layer having a satisfactory surface state is obtained.

[Method of Manufacturing Liquid-Ejecting Head]

An example of a method of manufacturing a liquid-ejecting head according to the present invention is described with reference to FIG. 2A to FIG. 2G. FIG. 2A to FIG. 2G are sectional views for illustrating the A-B section of the liquid-ejecting head illustrated in FIG. 1 for respective production steps.

Figure 2A:
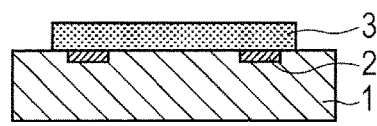
FIG. 2A, FIG. 2B, FIG. 2C, FIG. 2D, FIG. 2E, FIG. 2F, and FIG. 2G are each a sectional view for illustrating an example of a method of manufacturing a liquid-ejecting head according to the present invention.

First, as illustrated in FIG. 2A, a mold material 3 for forming a liquid channel is formed on or above the substrate 1 having arranged thereon the energy-generating element 2. A silicon substrate or the like can be used as the substrate 1. The mold material 3 can be formed by, for example, forming a positive photosensitive resin layer containing a positive photosensitive resin on or above the substrate and patterning the positive photosensitive resin layer. A resin having resistance to the formation and patterning of a coating layer 4a to be described later can be used as the positive photosensitive resin, though the positive photosensitive resin is not particularly limited thereto. For example, when the coating layer 4a is formed by application, such resistance that the pattern is not broken by a solvent in an applied liquid is required. A polymeric photolytic positive resist is preferred as such positive photosensitive resin. Specific examples thereof include polymethyl isopropenyl ketone, polymethyl methacrylate, and polymethylglutarimide. In addition, a pattern failure may occur owing to the exposure of the resin at the time of the exposure of the coating layer 4a, and hence a material having a low absorbance for the exposure wavelength of the coating layer 4a is preferred. Such positive photosensitive resin is, for example, a polymethyl isopropenyl ketone. One kind of those positive photosensitive resins may be used, or two or more kinds thereof may be used in combination.

The positive photosensitive resin layer can be formed by, for example, appropriately dissolving the positive photosensitive resin in a solvent, applying the solution according to a spin coating method, and then evaporating the solvent through baking. The thickness of the positive photosensitive resin layer is the height of the channel, is appropriately determined by the design of the liquid-ejecting head, and is not particularly limited. However, the thickness can be set to, for example, from 5 μm to 30 μm. The patterning of the positive photosensitive resin layer can be performed by, for example, the following method. The positive photosensitive resin layer is subjected to pattern exposure by being irradiated with an active energy ray capable of exposing the positive photosensitive resin through a mask as required. After that, development is performed with, for example, a solvent capable of dissolving the exposed portion of the positive photosensitive resin. Thus, the mold material 3 can be formed.

Figure 2D:
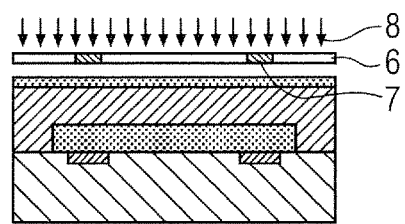
Figure 2B:
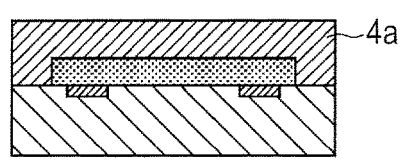

Next, as illustrated in FIG. 2B, the coating layer 4a serving as the member 4 is formed on the mold material 3 and the substrate 1. The coating layer 4a can contain a photocationically polymerizable resin and a photocationic polymerization initiator. The photocationically polymerizable resin is, for example, a photocationically polymerizable resin having an epoxy group, a vinyl ether group, or an oxetane group. However, a photocationically polymerizable resin having an epoxy group is preferred from the viewpoints of high mechanical strength of the layer and its strong adhesiveness with the base. Examples of the photocationically polymerizable resin having an epoxy group include epoxy resins, such as a bisphenol A-type epoxy resin and a novolac-type epoxy resin. Commercial products thereof are, for example, SU8 (trade name, manufactured by Nippon Kayaku Co., Ltd.) and EHPE 3150 (trade name, manufactured by Daicel Corporation). One kind of those resins may be used, or two or more kinds thereof may be used in combination. The epoxy equivalent of the photocationically polymerizable resin having an epoxy group is preferably 2,000 or less, more preferably 1,000 or less. When the epoxy equivalent is 2,000 or less, the crosslink density of the resin does not reduce at the time of its curing reaction, and hence reductions in glass transition temperature and adhesiveness of a cured product can be prevented. A lower limit for the epoxy equivalent is not particularly limited, but can be set to, for example, 50 or more. It should be noted that the epoxy equivalent is a value measured in conformity with JIS-K-7236. In addition, the photocationically polymerizable resin is preferably solid at 35° C. or less because resolution may reduce when the flowability of an applied film 5a to be described later is high.

In addition, for example, an onium salt, such as an ionic sulfonium salt- or iodonium salt-based initiator, can be used as the photocationic polymerization initiator. However, an onium salt having a phosphorus-based material $PF_6$ or an antimony-based material $SbF_6$ as an anion is preferred from the viewpoint of the magnitude of cationic polymerization activity. A commercial product thereof is, for example, SP-172 (trade name, manufactured by ADEKA Corporation). The coating layer 4a can be formed by, for example, applying, onto the mold material 3 and the substrate 1, a solution, which is prepared by appropriately dissolving the materials for the coating layer 4a in a solvent, according to a spin coating method. When the solvent is used, a solvent that hardly dissolves the mold material 3 can be selected and used. The thickness of the coating layer 4a is not particularly limited, but its thickness on the mold material 3 can be set to, for example, from 0.5 μm to 100 μm.

Figure 2E:
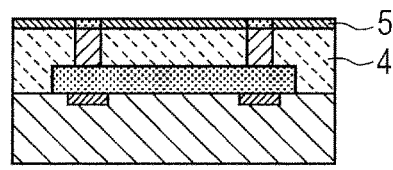
Figure 2C:
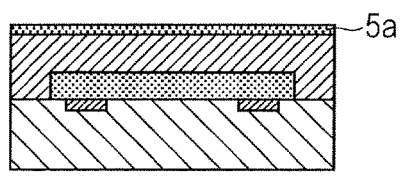

Next, as illustrated in FIG. 2C, the applied film 5a serving as a cured layer 5 having liquid repellency is formed on the coating layer 4a that is uncured. The applied film 5a can be formed by applying a mixed liquid containing the components (a) to (c) and the organic solvent. In addition, in the case where the coating layer 4a contains the photocationically polymerizable resin having an epoxy group, the film can be formed by applying a mixed liquid containing the component (a), the component (b), and an organic solvent that dissolves the photocationically polymerizable resin having an epoxy group. In this case, the photocationically polymerizable resin having an epoxy group in the coating layer 4a diffuses into the applied film 5a. A method of applying any such mixed liquid is, for example, a spin coating method or a slit coating method. The thickness of the applied film 5a is preferably such a thickness that the thickness of the cured layer 5 becomes from 50 nm to 20,000 nm. The applied film 5a may be formed on the entire surface of the coating layer, or may be partially formed on the periphery of a portion where the ejection orifice 9 is formed.

Next, as illustrated in FIG. 2D, the coating layer 4a and the applied film 5a are subjected to pattern exposure. For example, the curing regions of the coating layer 4a and the applied film 5a are irradiated with light 8 through a mask 6 having a light-shielding portion 7. For example, UV light can be used as the light 8. For example, a single-wavelength i-line light can be used as the UV light. When the coating layer 4a contains the photocationic polymerization initiator, in this step, an acid produced from the photocationic polymerization initiator diffuses into the applied film 5a.

Next, as illustrated in FIG. 2E, exposed portions are cured by heating the coating layer 4a and the applied film 5a. When a heating treatment is performed, the reaction of the exposed portions is accelerated and hence resistance in a subsequent developing step is improved. In this step, an ether bond is produced between the coating layer 4a and the applied film 5a by the reaction of an epoxy group. In addition, a dehydration condensation reaction between a hydroxyl group and a silanol group may proceed in the applied film 5a. Accordingly, when the coating layer 4a and the applied film 5a are collectively cured like the method according to the present invention, a strong bond is formed between the coating layer 4a and the applied film 5a, and hence the cured layer 5 having a high adhesion property is obtained. That is, high durability against a liquid is obtained. A heating temperature and a heating time vary depending on the materials for the coating layer 4a and the applied film 5a, but for example, the heating can be performed at from 50° C. to 220° C. for from 1 minute to 2 hours.

Figure 2F:
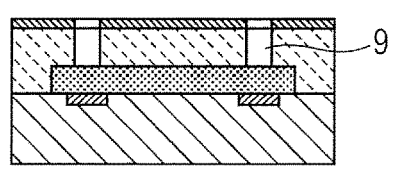

Next, as illustrated in FIG. 2F, the ejection orifice 9 is formed by removing the unexposed portions of the coating layer 4a and the applied film 5a. The unexposed portions of the coating layer 4a and the applied film 5a can be removed by being developed with a developing solution. The developing solution is not particularly limited as long as the developing solution is a solution capable of developing the unexposed portions of the coating layer 4a and the applied film 5a, but for example, a mixed liquid of methyl isobutyl ketone (MIBK) and xylene can be used. In addition, a rinsing treatment can be performed with isopropanol or the like after the developing treatment has been performed.

Figure 2G:
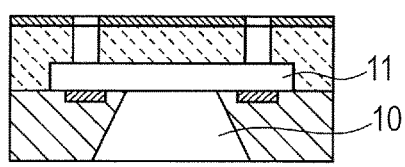

Next, as illustrated in FIG. 2G, the supplying portion 10 is formed in the substrate 1. In addition, the channel 11 is formed by removing the mold material 3. When the substrate 1 is a silicon substrate, the supplying portion 10 can be formed by a silicon processing technology, such as anisotropic etching involving using an alkaline solution. The mold material 3 can be removed by, for example, immersing the substrate 1 in a solvent capable of dissolving the mold material 3. In addition, the solubility of the mold material 3 may be improved as required by being exposed to an active energy ray capable of decomposing the mold material 3.

After that, electrical bonding for driving the energy-generating element 2 is performed, and for example, a liquid-supplying member for supplying a liquid is connected. Thus, the liquid-ejecting head is completed.

The liquid-ejecting head and the method of manufacturing the liquid-ejecting head according to the present invention are described below by way of Examples. However, the present invention is not limited to these Examples. The evaluations of the liquid-ejecting head were performed by the following methods.

(Ink Durability)

The first surface of a produced liquid-ejecting head was evaluated for its ink durability by the following method. The liquid-ejecting head was immersed in an ink and held at 60° C. for 1 week. After that, the head was washed with water and a pure water contact angle θr near an ejection orifice thereof was measured with a micro contact angle meter (product name: DropMeasure, manufactured by Microjet Corporation). A pigment ink having a pH of 9 or more and having added thereto a water-soluble resin for improving its ejectability was used as the ink. The ink reduces the water repellency of the first surface to a larger extent than a dye ink does.

(Mask Reproducibility)

Figure 3:
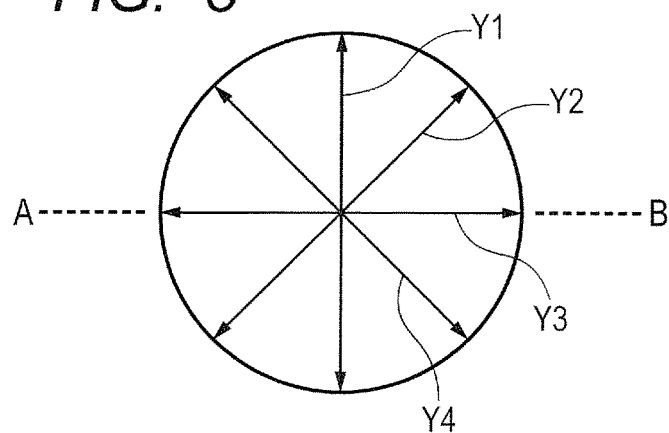
FIG. 3 is a top view of an ejection orifice of the liquid-ejecting head according to the present invention.

FIG. 3 is a view of the ejection orifice of the produced liquid-ejecting head when viewed from a side from which a liquid is ejected. In the ejection orifice illustrated in FIG. 3, lengths Y1 to Y4 were measured. It should be noted that reference symbols A and B of FIG. 3 correspond to reference symbols A and B of FIG. 1, respectively. The longest length and the shortest length out of the resultant four lengths Y1 to Y4 were defined as MAX(Y) and MIN(Y), respectively, and mask reproducibility was calculated in accordance with the following equation (Z). A smaller value for the mask reproducibility means that the ejection orifice has better mask reproducibility and higher definition.

Mask reproducibility=(MAX($Y$)−MIN($Y$))/MIN($Y$)× 100     Equation (Z)

EXAMPLE 1

First, as illustrated in FIG. 2A, the mold material 3 for forming a liquid channel was formed on the substrate 1 having arranged thereon the energy-generating element 2. Specifically, a solution prepared by dissolving a polymethyl isopropenyl ketone in a solvent was applied onto the substrate 1 having arranged thereon the energy-generating element 2 according to a spin coating method. After that, the solvent was evaporated by baking. Thus, a positive photosensitive resin layer was formed. The thickness of the positive photosensitive resin layer was 14 μm. Next, the positive photosensitive resin layer was subjected to pattern exposure by being irradiated with an active energy ray through a mask. After that, the exposed portion of the positive photosensitive resin layer was developed with a solvent. Thus, the mold material 3 was formed.

Next, as illustrated in FIG. 2B, the coating layer 4a was formed on the mold material 3 and the substrate 1. Specifically, 100 parts by mass of a photocationically polymerizable resin (trade name: EHPE 3150, manufactured by Daicel Corporation) and 6 parts by mass of a photocationic polymerization initiator (trade name: SP-172, manufactured by ADEKA Corporation) were dissolved in xylene. The solution was applied onto the mold material 3 and the substrate 1 according to a spin coating method. Thus, the coating layer 4a was formed.

Next, as illustrated in FIG. 2C, the applied film 5a was formed on the coating layer 4a that was uncured. Specifically, 12.53 g (0.045 mol) of γ-glycidoxypropyltriethoxysilane, 8.02 g (0.045 mol) of methyltriethoxysilane, 1.05 g (0.00091 mol) of the compound represented by the formula (9), 5.95 g of water, 13.4 g of ethanol, and 4.20 g of a hydrofluoroether (trade name: HFE7200, manufactured by 3M Japan Limited) were stirred in a flask provided with a cooling tube at room temperature for 5 minutes. After that, the mixture was heated to reflux for 24 hours to prepare (a) the condensate. Next, 21.6 g of an epoxy resin (trade name: EP-4000S, manufactured by Daicel Corporation) and 7.2 g of a fluorine atom-containing nonionic surfactant (trade name: MEGAFACE F-444, manufactured by DIC Corporation) were added to the condensate. Further, the mixture was diluted with 2-butanol and ethanol so that the content of a solid content became 7 mass %. The resultant solution was applied onto the coating layer 4a that was uncured with a slit coater. Thus, the applied film 5a was formed.

Next, as illustrated in FIG. 2D, the curing regions of the coating layer 4a and the applied film 5a were irradiated with the i-line light 8 through the mask 6 having the light-shielding portion 7. A perfect circle pattern mask whose dimensions had been designed so as to have a diameter of 15 μm was used as the mask 6. In addition, i-line exposure was performed while an exposure value was changed in the range of from 4,000 J/m$^2$ to 6,000 J/m$^2$ in a stepwise manner, and the exposure value at which the distance Y1 of FIG. 3 became just 15 μm was used as an optimum exposure value.

Next, as illustrated in FIG. 2E, a heating treatment was performed at 95° C. for 4 minutes to accelerate the curing reaction of the exposed portions of the coating layer 4a and the applied film 5a. Thus, the member 4 and the cured layer 5 were formed.

Next, as illustrated in FIG. 2F, the unexposed portions of the coating layer 4a and the applied film 5a were removed by using a mixed liquid of methyl isobutyl ketone (MIBK) and xylene. After that, a rinsing treatment was performed with isopropanol. Thus, the ejection orifice 9 was formed.

Next, as illustrated in FIG. 2G, the supplying portion 10 was formed in the substrate 1. In addition, the channel 11 was formed by removing the mold material 3. Specifically, the supplying portion 10 was formed by subjecting the substrate 1 to anisotropic etching with an alkaline solution. In addition, the mold material 3 was removed by immersing the substrate 1 in methyl lactate. Thus, the channel 11 was formed.

After that, electrical bonding for driving the energy-generating element 2 was performed. Further, a liquid-supplying member for supplying a liquid or the like was connected. Thus, a liquid-ejecting head was completed. The liquid-ejecting head was subjected to the evaluations. The results are shown in Table 1.

EXAMPLES 2 to 21 and COMPARATIVE EXAMPLES 1 to 6

Liquid-ejecting heads were each produced in the same manner as in Example 1 except that the applied film 5a was formed by using materials and a formation method shown in Table 1, and the heads were evaluated in the same manner as in Example 1. The results are shown in Table 1.

It should be noted that in Comparative Example 5, a film having a thickness of 1 μm was obtained by: applying a mixed solution of the materials shown in Table 1 onto a PET film having a thickness of 100 μm; and baking the solution at 90° C. for 5 minutes to volatilize PGMEA. Next, the cured layer 5 was formed by transferring the film onto the coating layer 4a through the use of a lamination method while applying heat at 50° C.

In addition, in Comparative Example 6, benzene that was an organic solvent in which the coating layer 4a was insoluble or hardly soluble was used as an organic solvent. Organic solvents used in Examples 1 to 21 and Comparative Examples 1 to 5 are different from the organic solvent of Comparative Example 6 in that each of the solvents dissolves the coating layer 4a.

TABLE 1

| | (a) Condensate | | | | | | |
|---|---|---|---|---|---|---|---|
| | A | B | C | D | A/B/C/D (mol %) | Condensation degree (%) | (b) Surfactant |
| Example 1 | (1) | GPTES | MTEOS | — | 1/49.5/49.5/0 | 56 | F-444 |
| Example 2 | (1) | GPTES | MTEOS | PhTES | 1/49.5/24.8/24.7 | 57 | F-444 |
| Example 3 | (1) | GPTES | MTEOS | PhTES | 1/49.5/24.8/24.7 | 57 | F-444 |
| Example 4 | (1) | GPTES | MTEOS | PhTES | 1/49.5/24.8/24.7 | 57 | F-444 |
| Example 5 | (1) | GPTES | MTEOS | — | 1/49.5/49.5/0 | 56 | F-444 |
| Example 6 | (1) | GPTES | MTEOS | — | 1/49.5/49.5/0 | 56 | F-444 |
| Example 7 | (1) | GPTES | MTEOS | PhTES | 1/49.5/24.8/24.7 | 57 | F-555 |
| Example 8 | (1) | GPTES | MTEOS | — | 1/49.5/49.5/0 | 56 | F-482 |
| Example 9 | (1) | GPTES | MTEOS | TFPTES | 1/49.5/24.8/24.7 | 57 | F-444 |
| Example 10 | (1) | GPTES | MTEOS | TFPTES | 1/49.5/24.8/24.7 | 57 | F-444 |
| Example 11 | (1) | GPTES | MTEOS | TFPTES | 1/49.5/24.8/24.7 | 57 | F-555 |
| Example 12 | (1) | GPTES | MTEOS | TFPTES | 1/49.5/24.8/24.7 | 57 | F-557 |
| Example 13 | (2) | GPTES | MTEOS | — | 1/49.5/49.5/0 | 55 | F-444 |
| Example 14 | (3) | GPTES | MTEOS | — | 1/49.5/49.5/0 | 57 | F-444 |
| Example 15 | (4) | GPTES | MTEOS | — | 1/49.5/49.5/0 | 58 | F-444 |
| Example 16 | (5) | GPTES | MTEOS | — | 1/49.5/49.5/0 | 60 | F-444 |
| Example 17 | (1) | GPTES | MTEOS | — | 1/49.5/49.5/0 | 56 | F-444 |
| Example 18 | (1) | GPTES | MTEOS | TFPTES | 1/49.5/24.8/24.7 | 57 | F-444 |
| Example 19 | (1) | GPTES | MTEOS | PhTES | 1/49.5/24.8/24.7 | 57 | F-482 |
| Example 20 | (1) | GPTES | MTEOS | PhTES | 1/49.5/24.8/24.7 | 57 | F-482 |
| Example 21 | (1) | GPTES | MTEOS | PhTES | 1/49.5/24.8/24.7 | 57 | F-482 |
| Comparative Example 1 | (1) | GPTES | MTEOS | — | 1/49.5/49.5/0 | 56 | — |
| Comparative Example 2 | (1) | GPTES | MTEOS | — | 1/49.5/49.5/0 | 56 | — |
| Comparative Example 3 | (1) | GPTES | MTEOS | — | 1/49.5/49.5/0 | 56 | KF-6011 |
| Comparative Example 4 | (1) | GPTES | MTEOS | — | 1/49.5/49.5/0 | 56 | KF-6011 |
| Comparative Example 5 | (1) | GPTES | MTEOS | — | 1/49.5/49.5/0 | 56 | F-482 |
| Comparative Example 6 | (1) | GPTES | MTEOS | — | 1/49.5/49.5/0 | 56 | F-482 |

| | (c) Epoxy resin | Organic solvent | Method of forming layer | Ink durability θr (°) | Mask reproducibility |
|---|---|---|---|---|---|
| Example 1 | EP-4000S | 2-Butanol/ethanol | Application | 90 | 0.25 |
| Example 2 | EHPE 3150 | 2-Butanol/ethanol | Application | 89 | 0.26 |
| Example 3 | EHPE 3150 | Ethanol | Application | 89 | 0.30 |
| Example 4 | EP-4000S | 2-Butanol/ethanol | Application | 90 | 0.27 |
| Example 5 | EP-4000S | 2-Butanol/ethanol | Application | 90 | 0.25 |
| Example 6 | EP-4000S | Isopropanol/ethanol | Application | 90 | 0.24 |
| Example 7 | EHPE 3150 | 2-Butanol/ethanol | Application | 84 | 0.27 |
| Example 8 | EP-4000S | 2-Butanol/ethanol | Application | 85 | 0.23 |
| Example 9 | EHPE 3150 | 2-Butanol/ethanol | Application | 90 | 0.25 |
| Example 10 | EP-4000S | 2-Butanol/ethanol | Application | 89 | 0.26 |
| Example 11 | EHPE 3150 | 2-Butanol/ethanol | Application | 84 | 0.28 |
| Example 12 | EHPE 3150 | 2-Butanol/ethanol | Application | 83 | 0.29 |
| Example 13 | EP-4000S | 2-Butanol/ethanol | Application | 90 | 0.25 |
| Example 14 | EP-4000S | 2-Butanol/ethanol | Application | 89 | 0.26 |
| Example 15 | EP-4000S | 2-Butanol/ethanol | Application | 89 | 0.25 |
| Example 16 | EP-4000S | 2-Butanol/ethanol | Application | 90 | 0.24 |
| Example 17 | — | Ethanol | Application | 88 | 0.30 |

TABLE 1-continued

| | | | | | |
|---|---|---|---|---|---|
| Example 18 | — | 2-Butanol/ethanol | Application | 88 | 0.25 |
| Example 19 | — | 2-Butanol/ethanol | Application | 80 | 0.23 |
| Example 20 | EHPE 3150 | PGMEA | Application | 72 | 0.24 |
| Example 21 | JER157S70 | PGMEA | Application | 75 | 0.25 |
| Comparative Example 1 | — | Ethanol | Application | — | 0.78 |
| Comparative Example 2 | EHPE 3150 | Ethanol | Application | — | 0.81 |
| Comparative Example 3 | EHPE 3150 | Ethanol | Application | — | 0.55 |
| Comparative Example 4 | — | Ethanol | Application | — | 0.53 |
| Comparative Example 5 | — | PGMEA | Lamination | — | 0.92 |
| Comparative Example 6 | — | Benzene | Application | — | 0.90 |

Abbreviations in Table 1 are as described below.
(1): Compound represented by the formula (11)
(2): Compound represented by the formula (12)
(3): Compound represented by the formula (8)
(4): Compound represented by the formula (9)
(5): Compound represented by the formula (10)
GPTES: γ-Glycidoxypropyltriethoxysilane
MTEOS: Methyltriethoxysilane
PhTES: Phenyltriethoxysilane
TFPTES: Trifluoropropyltriethoxysilane
F-444: Fluorine atom-containing nonionic surfactant (trade name: MEGAFACE F-444, manufactured by DIC Corporation)
F-482: Fluorine atom-containing nonionic surfactant (trade name: MEGAFACE F-482, manufactured by DIC Corporation)
F-555: Fluorine atom-containing nonionic surfactant (trade name: MEGAFACE F-555, manufactured by DIC Corporation)
F-557: Fluorine atom-containing nonionic surfactant (trade name: MEGAFACE F-557, manufactured by DIC Corporation)
KF-6011: Polyether-modified silicone surfactant (trade name: KF-6011, manufactured by Shin-Etsu Chemical Co., Ltd.)
JER157S70: Epoxy resin (trade name: JER157S70, manufactured by Mitsubishi Chemical Corporation.)
PGMEA: Propylene glycol monomethyl ether acetate It was confirmed from Table 1 that each of the liquid-ejecting heads produced in Examples 1 to 21 had a large θr after the immersion in the ink in the evaluation for ink durability, and hence showed satisfactory liquid repellency and satisfactory ink durability. In addition, in each of the heads, the value for mask reproducibility was 0.30 or less, in other words, high mask reproducibility was obtained. As can be seen from the foregoing, in any of the conditions of Examples 1 to 21, a high-definition ejection orifice that had high liquid repellency and high ink durability, did not cause any agglomeration or residue in an applied surface, and had high mask reproducibility was obtained. Further, when a printing evaluation was performed by using any one of the liquid-ejecting heads, a printing kink or the like was not observed, and hence high printing quality was obtained.

On the other hand, in each of Comparative Examples 1 to 6, the θr could not be quantified because the θr did not stabilize owing to the occurrence of: the agglomeration of an applied liquid; and a residue after development. In addition, the mask reproducibility was low. Particularly in each of Comparative Examples 5 and 6, the mask reproducibility was additionally low because the agglomeration of the applied liquid and the residue after the development remarkably occurred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-029342, filed Feb. 18, 2015, which is hereby incorporated by reference herein in its entirety.

What is claimed is:

1. A liquid-ejecting head, comprising a member having opened therein an ejection orifice configured to eject a liquid, wherein the liquid-ejecting head has, on a side being positioned on the member and having opened therein the ejection orifice, a cured layer of a mixture containing:
   a condensate of hydrolyzable silane compounds containing a hydrolyzable silane compound having 20 or more fluorine atoms and a hydrolyzable silane compound having a cationically polymerizable group;
   a fluorine atom-containing nonionic surfactant; and
   an epoxy resin,
   wherein the fluorine atom-containing nonionic surfactant includes a polyoxyethylene alkyl ether, a polyoxyethylene aryl ether, or a polyoxyethylene dialkyl ester substituted by fluorine atoms.

2. The liquid-ejecting head according to claim 1, wherein the fluorine atom-containing nonionic surfactant has a fluorine atom-containing group, and the fluorine atom-containing group has 9 or more fluorine atoms.

3. The liquid-ejecting head according to claim 1, wherein the epoxy resin has a hydroxyl group.

4. The liquid-ejecting head according to claim 1, wherein the hydrolyzable silane compound having 20 or more fluorine atoms comprises at least one compound selected from the group consisting of compounds represented by formulae (1), (2), (3), and (4):

$$F\text{-}Rp\text{-}A\text{-}SiX_aY_{3-a} \qquad \text{formula (1)}$$

wherein, in the formula (1), Rp represents a perfluoropolyether group, A represents an organic group having 1 to 12 carbon atoms, X represents a hydrolyzable substituent, Y represents a nonhydrolyzable substituent, and a represents an integer of 1 to 3;

$$R_{3-a}X_aSi\text{-}A\text{-}Rp\text{-}A\text{-}SiX_aY_{3-a} \qquad \text{formula (2)}$$

wherein, in the formula (2), R represents a nonhydrolyzable substituent, Rp represents a perfluoropolyether group, A represents an organic group having 1 to 12 carbon atoms, X represents a hydrolyzable substituent, Y represents a nonhydrolyzable substituent, and a represents an integer of 1 to 3;

  formula (3)

wherein, in the formula (3), A represents an organic group having 1 to 12 carbon atoms, Z represents a hydrogen atom or an alkyl group, $Q^1$ represents a divalent bonding group, m represents an integer of 1 to 4, Rp represents a perfluoropolyether group, X represents a hydrolyzable substituent, Y represents a nonhydrolyzable substituent, and a represents an integer of 1 to 3;

  formula (4)

wherein, in the formula (4), Rp represents a perfluoropolyether group, A represents an organic group having 1 to 12 carbon atoms, X represents a hydrolyzable substituent, Y represents a nonhydrolyzable substituent, a represents an integer of 1 to 3, and n represents 1 or 2, where when n=1, $Q^2$ represents a divalent bonding group, and when n=2, $Q^2$ represents a trivalent bonding group.

5. The liquid-ejecting head according to claim 4, wherein Rp in each of the formulae (1), (2), (3), and (4) is represented by formula (5):

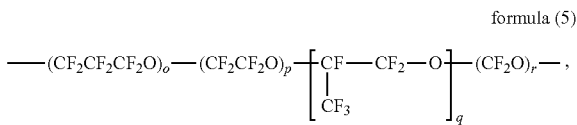  formula (5)

wherein, in the formula (5), o, p, q, and r each represent an integer of 0 or 1 or more, and at least one of o, p, q, or r represents an integer of 1 or more.

6. The liquid-ejecting head according to claim 5, wherein at least one of o, p, q, or r in the formula (5) represents an integer of 1 to 10.

7. The liquid-ejecting head according to claim 1, wherein the condensate comprises a condensate obtained by heating the hydrolyzable silane compounds in a mixed liquid of a non-fluorine-based organic solvent and a fluorine-based solvent.

8. The liquid-ejecting head according to claim 7, wherein the mixed liquid of the non-fluorine-based organic solvent and the fluorine-based solvent comprises a mixed liquid of an alcohol free of a fluorine atom and a hydrofluoroether.

9. The liquid-ejecting head according to claim 1, wherein the hydrolyzable silane compound having the cationically polymerizable group comprises a compound represented by formula (6):

  formula (6)

wherein, in the formula (6), Rc represents a nonhydrolyzable substituent having an epoxy group, an oxetane group, or a cationically polymerizable vinyl group, R represents a nonhydrolyzable substituent, X represents a hydrolyzable substituent, and b represents an integer of 0 to 2.

10. The liquid-ejecting head according to claim 1, wherein the condensate comprises a condensate of the hydrolyzable silane compounds containing the hydrolyzable silane compound having 20 or more fluorine atoms, the hydrolyzable silane compound having the cationically polymerizable group, and a hydrolyzable silane compound represented by formula (7):

  formula (7)

wherein, in the formula (7), Rd represents a substituted or unsubstituted alkyl group having 1 to 13 carbon atoms, or a substituted or unsubstituted aryl group having 6 to 13 carbon atoms, X represents a hydrolyzable substituent, and a represents an integer of 1 to 3.

11. The liquid-ejecting head according to claim 1, wherein the member comprises a cured product of the epoxy resin.

12. The liquid-ejecting head according to claim 1, wherein a content of the fluorine atom-containing nonionic surfactant in the mixture is from 0.01 mass % to 20 mass %.

13. The liquid-ejecting head according to claim 1, wherein a content of the fluorine atom-containing nonionic surfactant in the mixture is from 0.1 mass % to 15 mass %.

14. The liquid-ejecting head according to claim 1, wherein a content of the epoxy resin in the mixture is from 5 mass % to 90 mass %.

15. The liquid-ejecting head according to claim 1, wherein the member comprises a cured product of an epoxy resin different from the epoxy resin in the cured layer.

* * * * *